United States Patent
Sundaresh et al.

(10) Patent No.: US 11,474,132 B2
(45) Date of Patent: Oct. 18, 2022

(54) METHOD AND APPARATUS FOR DETECTING AND REPORTING TAMPERING OF AN ENERGY METER

(71) Applicant: Honeywell International Inc., Charlotte, NC (US)

(72) Inventors: Nagaraja Sundaresh, Haryana (IN); Rajesh Mahapatra, Haryana (IN); Shalu Singhvi, Talangana (IN)

(73) Assignee: Honeywell International Inc., Charlotte, NC (US)

( * ) Notice: Subject to any disclaimer, the term of this patent is extended or adjusted under 35 U.S.C. 154(b) by 0 days.

(21) Appl. No.: 17/087,917

(22) Filed: Nov. 3, 2020

(65) Prior Publication Data

US 2022/0137109 A1    May 5, 2022

(51) Int. Cl.
*G01R 22/06*    (2006.01)
*G01D 4/00*    (2006.01)
*G01R 11/24*    (2006.01)

(52) U.S. Cl.
CPC .......... *G01R 22/066* (2013.01); *G01D 4/002* (2013.01); *G01R 11/24* (2013.01)

(58) Field of Classification Search
CPC .... G01R 22/06; G01R 22/061; G01R 22/066; G01R 11/02; G01R 11/24; G06Q 50/06
See application file for complete search history.

(56) References Cited

U.S. PATENT DOCUMENTS

| | | | | |
|---|---|---|---|---|
| 6,232,886 | B1* | 5/2001 | Morand | G08B 13/1409 324/110 |
| 7,495,555 | B2* | 2/2009 | Seal | G01R 22/066 340/4.3 |
| 2004/0021568 | A1* | 2/2004 | Seal | G01R 22/066 340/870.3 |
| 2004/0150384 | A1* | 8/2004 | Hoile | G01R 22/066 324/110 |
| 2007/0103334 | A1* | 5/2007 | Soni | G01D 4/002 340/870.02 |
| 2007/0247789 | A1* | 10/2007 | Benson | G06Q 50/06 361/672 |
| 2013/0088353 | A1* | 4/2013 | LaFrance | G01R 11/24 340/551 |

(Continued)

OTHER PUBLICATIONS

Messinis. et al: Review of non-technical loss detection methods, Electric Power Systems Redearch, vol. 158, May 1, 2018 (May 1, 2018), pp. 250-266, XP055906788.

(Continued)

*Primary Examiner* — Huy Q Phan
*Assistant Examiner* — David B Frederiksen
(74) *Attorney, Agent, or Firm* — Paschall & Associates, LLC; James C. Paschall

(57) ABSTRACT

This disclosure relates to a method and apparatuses for detecting and reporting suspected tampering of an energy meter to a utility. The method and apparatus uses a plurality of sensors to obtain data relating to one or more input parameters based on the type of input signal. The input parameters are mapped with a tamper type to provide a classification of one or more output parameters. The output parameters are compared to one or more operating conditions of the energy meter to identify one or more suspected tampers. Any suspected tampers are reported to the utility.

20 Claims, 7 Drawing Sheets

(56) References Cited

U.S. PATENT DOCUMENTS

2016/0349294 A1* 12/2016 Saneyoshi ............ G01R 21/133
2019/0260204 A1*  8/2019 Koval .................... G06N 3/126
2020/0027026 A1   1/2020 Cook et al.

OTHER PUBLICATIONS

Buzau et al: "Hybrid Deep Neural Networks for Detection of Non-Technical Losses in Electricity Smart Meters", IEEE Transactions On Power Systems, IEEE, USA, vol. 35, No. 2, Sep. 23, 2019.
Ceatterjee et al: ,'Detection of non-technical losses using advanced metering infrastructure and deep recurrent neural networking, Jun. 6, 2017 (Jun. 6, 2017), pp. 1-6, XP033117894.
Pei et al: Data-Driven Measurement Tampering Detection Considering Spatial-Temporal Correlations 2019 IEEE 3RD Conference On Energy Internet and Energy System Integration.
Cyro et al: Irregularity Detection on Low Tension Electric Installations by Neural Network Ensembles; Proceedings of International Joint Conference on Neural Networks, Atlanta, Georgia, USA, Jun. 14-19, 2009.
Buzau et al: Detection of Non-Technical Losses Using Smart Meter Data and Supervised Learning; IEEE Transactions On Smart Grid, IEEE, USA, vol. 10, No. 3, May 1, 2019.
European search Report for corresponding EP Application No. 21205390.4 dated Apr. 8, 2022.

\* cited by examiner

METHOD AND APPARATUS FOR DETECTING AND REPORTING TAMPERING OF AN ENERGY METER

TECHNICAL FIELD

The present disclosure relates to detecting and reporting tampering of an energy meter. More specifically, the present invention relates to a method and an apparatus for automatically detecting a suspected tamper of an energy meter using machine learning.

BACKGROUND

Utility companies that generate and deliver electrical energy monitor electrical energy consumption and usage by households and industries through an electrical energy meter. Theft of electrical energy by way of tampering with the meter has become a major concern for utility companies. Due to energy theft, utilities realize huge losses and major reductions in profitable operations.

Many techniques and devices for tampering with an energy meter are known that are used to disturb, stop, obstruct or reduce measurements of electrical energy made by a meter, such as for example, high frequency spark generators, jammers, magnets, burning of the meter and magnetrons. Detecting all of these types of tampers becomes difficult because of the inability for a single sensor to detect each of the above-mentioned tampers.

The tampers which are easily detected by current detection methods are magnetic tampers (with AC and DC magnets) and tampers that open an energy meter's cover. However, it remains difficult to detect, tampers using ESD, jammer devices, microwave sources and by physically damaging the meter terminals and by drilling into the meter to damage its measurement components.

Currently, there are no methods or systems to help utility companies to detect all of the various types of meter tampering. Additionally, known existing techniques for detecting a tamper are not effective for detecting and/or isolating a single household's theft of electrical energy. Worldwide, utility companies have very stringent cost targets for energy meter devices. Adding additional hardware, or increasing manual inspection of meters, would adversely impact the cost of the meter which makes such solutions uncompetitive.

Therefore, there is a requirement for a cost-effective apparatus and method for the reliable detection of all types of energy meter tampering.

SUMMARY

Various embodiments are disclosed to detect tamper to the energy meter using neural network algorithm.

In accordance with an exemplary embodiment, a method for detecting and reporting to a utility company a suspected tamper of an energy meter is disclosed. The method comprises obtaining using a plurality of sensors data relating to one or more input parameters, the plurality of sensors configured to sense the input parameter data based on a type of input signals. The method includes mapping one or more of the input parameters with a tamper type to provide classification of one or more output parameters. The method further includes comparing one or more operating conditions of the energy meter with the one or more output parameters. Further, the method includes identifying one or more suspected tamper using the comparison and updating the mapping of the one or more input parameters with the suspected tamper identified. The method also includes reporting the suspected meter tampering to the utility.

In accordance with another exemplary embodiment, an apparatus for detecting and reporting suspected tampering of an energy meter. The apparatus comprising a plurality of sensors configured to obtain data relating to one or more input parameters, the plurality of sensors configured to sense the input parameter data based on a type of input signal. The apparatus further includes a communication module connected between the energy meter and a utility, at least one memory configured to store an algorithm and at least one processor coupled to the at least one memory and the communication module. The apparatus is configured to map the one or more input parameters with a tamper type to provide classification of one or more output parameters and compare one or more operating conditions of the energy meter with the one or more output parameters using the algorithm. The apparatus is further configured to identify one or more suspected tamper types using the comparison and update the algorithm, in order to change the mapping of the one or more input parameters with the suspected tamper type identified. The apparatus is further configured to report the suspected tamper to the utility using the communication module.

In accordance with yet another exemplary embodiment, a non-transitory computer readable medium, the non-transitory computer readable medium comprising instructions that, when executed, cause a processing device to obtain using a plurality of sensors data relating to one or more input parameters, the plurality of sensors configured to sense the input parameter data based on a type of input signals. The instruction when executed causing the processing device to map one or more of the input parameters with a tamper type to provide classification of one or more output parameters and compare one or more operating conditions of the energy meter with the one or more output parameters. Further, the instruction when executed cause the processing device to identify one or more suspected tamper types using the comparison and to update the mapping of the one or more input parameters with the suspected tamper type identified. Further, the instruction when executed cause the processing device to report the suspected meter tampering to a utility.

These and other features, aspects, and advantages of the present disclosure are further explained by the following detailed description, drawing and appended claims.

BRIEF DESCRIPTION OF THE DRAWING

For a more complete understanding of this disclosure, reference is now made to the following description, taken in conjunction with the accompanying drawings, in which.

DETAILED DESCRIPTION

FIGS. 1 through 8, discussed below, and the description of various embodiments used to describe the principles of the present invention are provided by way of illustration only and should not be construed in any way to limit the scope of the invention. Those skilled in the art will understand that the principles of the invention can be implemented in any type of suitably arranged device or system.

Figure 1:
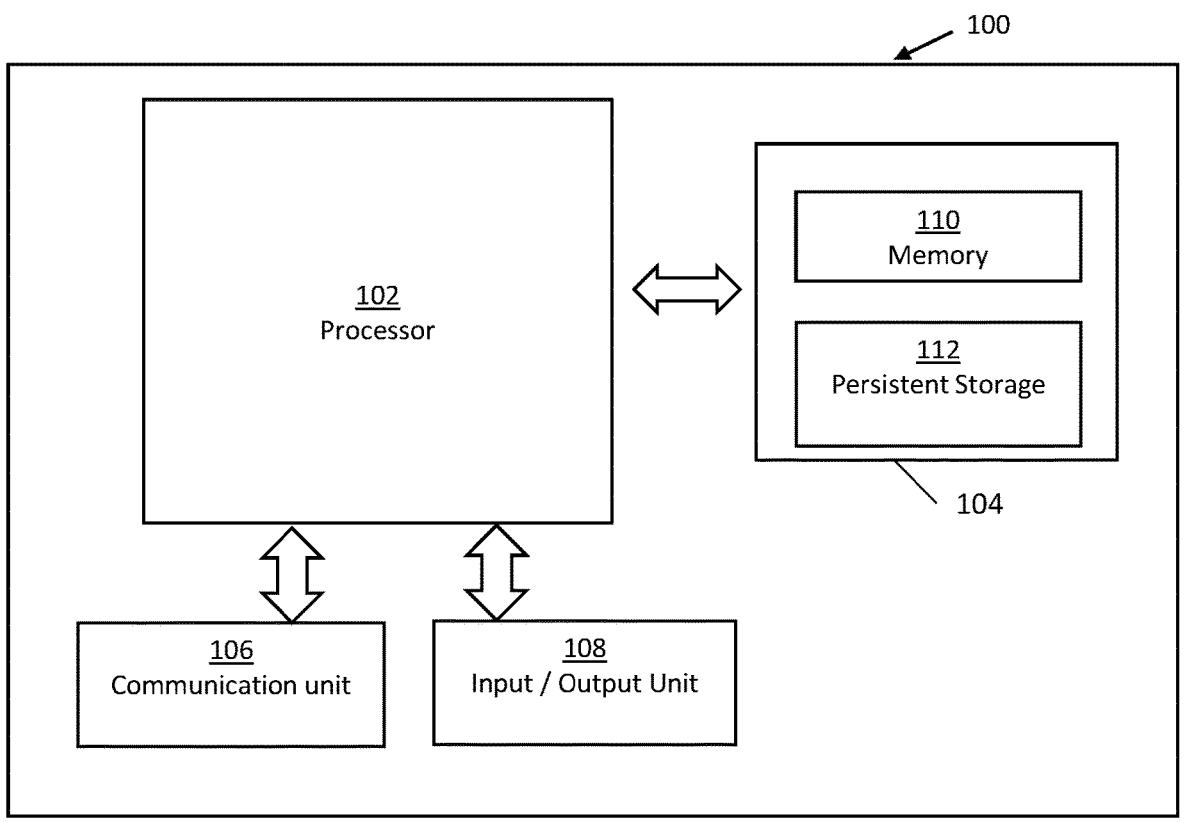
FIG. 1 illustrates an example system for detecting tamper to an energy meter in accordance to features of the embodiments.

FIG. 1 illustrates an example system 100 supporting an architecture to detect a tamper to an energy meter in accordance with this present disclosure. The system 100 may be installed in an energy meter as a separate module that communicates with the energy meter or may be configured to be a part of the components that operate the energy meter in the measurement and reporting of electrical energy usage. The system 100 includes at least one processor 102, at least one storage device 104, at least one communications unit 106, and at least one input/output ("I/O") unit 108. Each processor 102 can execute instructions that are loaded into a memory 110. For example, the instructions can implement various functions described in the present document for using the supporting architecture to detect the type of tamper. Each processor 102 can denote any suitable processing device, including one or more microprocessors, microcontrollers, digital signal processors, application specific integrated circuits ("ASICs"), field programmable gate arrays ("FPGAs"), or discrete circuitry.

The memory 110 and a persistent storage 112 are examples of storage devices 104, which represent any structure(s) capable of storing and facilitating retrieval of information including data, program code, and/or other suitable information on a temporary or permanent basis. An algorithm stored in a persistent storage 112, coupled to the at least one processor 102, is configured to map one or more input parameters with a tamper type to provide a classification of one or more output parameters. The algorithm is adapted to operate in one or more networks including, but not be limited to, any of a Multilayer Perceptron (MLP), Convolutional Neural Network (CNN), Recurrent Neural Network (RNN) or Long Short-Term Memory (LSTM). A memory 110 coupled to the at least one processor 102 can also represent a random-access memory or any other suitable volatile or non-volatile storage device(s). The persistent storage 112 can contain one or more components or devices supporting longer-term storage of data including a read only memory, hard drive, flash memory, or optical disc.

The communications unit 106 can support communications with other systems or devices. For example, the communications unit 106 can include at least one network interface card or wireless transceiver facilitating communications over at least one wired or wireless network. The communications unit 106 can support communications through any suitable physical or wireless communication link(s).

The I/O unit 108 can allow for input and output of data. For example, the I/O unit 108 can provide a connection for user input through a keyboard, mouse, keypad, touchscreen, or other suitable input device. The I/O unit 108 can also send output to a display, printer, or other suitable output device.

Figure 2:
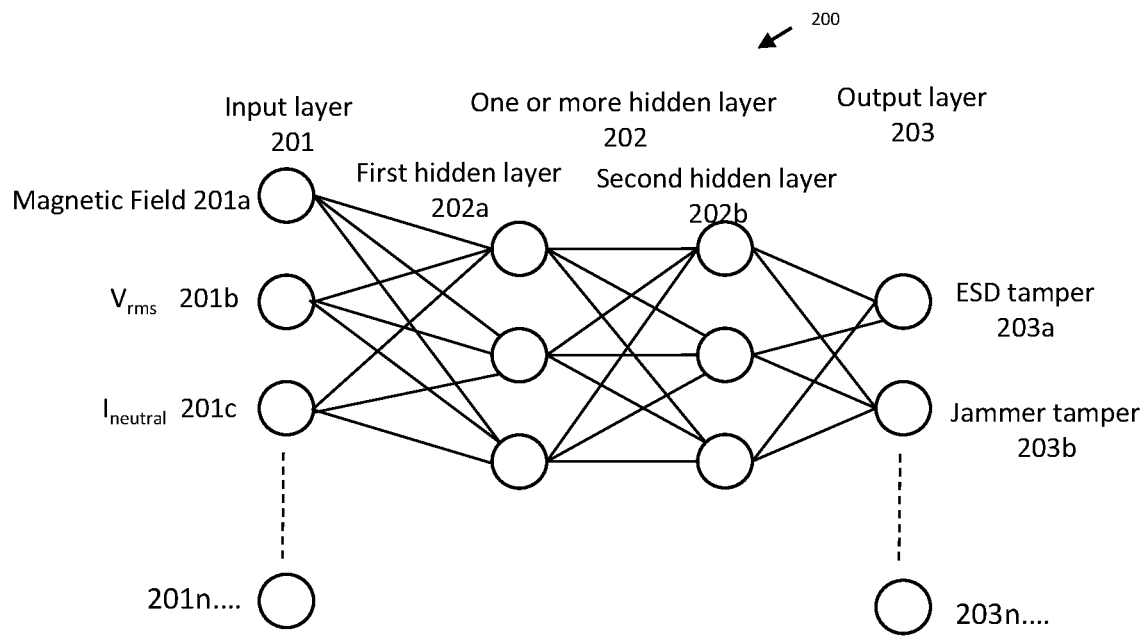
FIG. 2 illustrates an example of a graph that represents a neural network algorithm used to classify tampers to an energy meter in accordance to features of the embodiments.

FIG. 2 illustrates a graph 200 representing a machine learning algorithm for the classification of tampers. The algorithm 200 is stored in at least one memory 110 of the system 100. Graph 200 operates as a multilayer neural network with each node connected to a node from the next layer which may be for example, a standard multilayer perceptron (MLP) or a cascade of single-layer perceptrons, in accordance to this disclosure. The neural network may not be limited to MLP and can be extended to a CNN, RNN or LSTM topologies or combinations thereof. A range of machine learning algorithms can be potentially used for the classification of the tampers. Supervised, unsupervised, deep or shallow learning algorithms with a range of selected hyperparameters that can be applied to obtain the tamper classification by the system 100 used in the energy meter. The selection of the hyperparameters can be one or more tuning parameters that provide control learning to the neural network of the algorithm. The one or more tuning parameters may be a value of the hyperparameters in terms of node weight of the multilayer neural network.

In accordance with this disclosure and as shown in FIG. 2, the multilayer neural network may include at least three network layers such as an input layer 201, one or more hidden layers 202, and an output layer 203. The exemplary graph 200, in accordance with this disclosure, shows a 4-layer model where there are two hidden layers 202, including a first hidden layer 202a and a second hidden layer 202b. The input layer 201 provides the initial data for the neural network. The one or more hidden layers 202 are intermediate layers between the input 201 and output layer 203. The output layer 203 produces the result for given inputs. In accordance with this disclosure, the input layer 201 may include input variables from a plurality of input parameters including at least one of a magnetic field 201a, $V_{rms}$ 201b, and $I_{neutral}$ 201c.

In accordance with this disclosure, a magnetic field 201a is one of the input parameters which can cause tampering using a high magnetic field through a magnetron type of tempering device. Similarly, the variation in $V_{rms}$ 201b, and $I_{neutral}$ 201c can be a cause of tampering using different tampering tools such as a high spark generator. A neutral disturbance can be caused by still another type of tampering tool such as a jammer, or by burning the meter which can cause variation in the input parameters. The input layer may include n number of input parameters 201n that are fed to the one or more hidden layers 202 for computation. The n number of input parameter 201n may include at least one of temperature, voltage, current, power, vibration or frequency. The one or more hidden layers 202 perform nonlinear transformations to the plurality of input parameters 201n received from the input layer 201. The computation of the plurality of input parameters 201n are fed to the output layer 203 to provide the output variables such as at least one output parameter 203n. In accordance with this disclosure, the output layer provides at least one output parameter that can identify the suspected tamper, such as the suspected tampers shown in graph 200, that may include at least one of ESD tamper 203a, jammer tamper 203b and other tamper 203n.

In FIG. 2, the graph 200 illustrates a neural network 200 that is fed with the labeled data of different tamper and non-tamper types so that the neural network learns the parameters using the algorithms and a backpropagation analysis. The backpropagation analysis provides training to the neural network 200 which involves calculation of weights of each node of the multilayers neural network, including the input layer, one or more of the hidden layers and the output layer of the neural network 200. An energy meter may include a system 100 that has its neural network learn the various tamper types offline and the learned parameters programmed to the system using the backpropagation analysis. Alternately, or additionally, the learning could happen online in the system 100 while operating with the energy meter.

Figure 3:
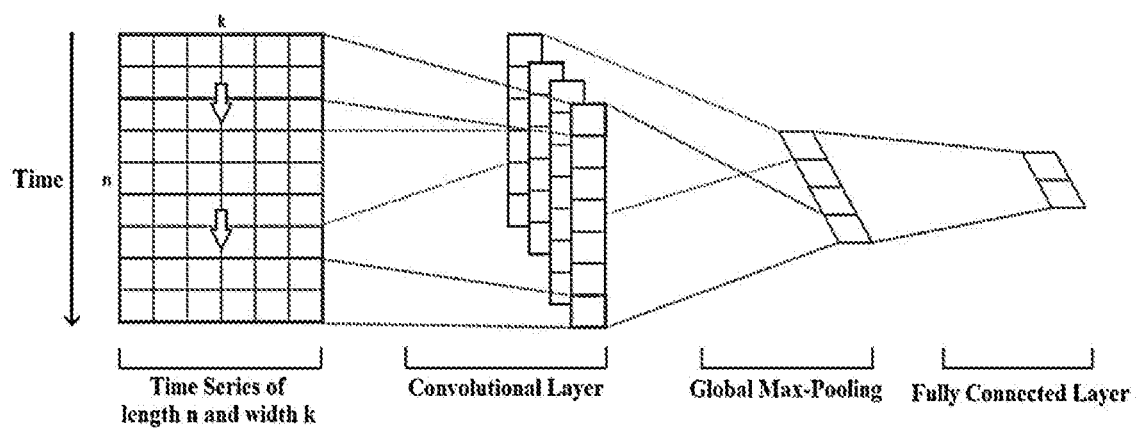
FIG. 3 illustrates an example architecture of a multilayer neural network for classifying sets of time series data in accordance with features of the embodiments.

FIG. 3 shows an architecture of a Convolutional Neural Network (CNN) used for classifying sets of time series data in accordance with this disclosure. The CNN neural network includes at least three layers such as a convolution layer, a pooling layer, and a fully connected layer. In the CNN neural network, the input consists of images unlike a regular neural network, the layers of a ConvNet have neurons arranged in 3 dimensions: width, height and depth. In accordance with this disclosure, a plurality of input parameter in the form of an input image data in a timeseries with a length n and a width k are fed to a stack of the convolutional layer in the CNN neural network. The plurality of input parameters n are fed to the stack of the convolutional layer of the CNN neural network. The plurality of input parameters such as for example, at least one of magnetic field axis X, magnetic field axis Y, magnetic field axis Z, temperature, vibration input, RMS voltage, peak voltage, fourier components of voltage and currents, RMS phase current, RMS neutral current, R, Y, B voltages and currents, power factor or line frequency are analyzed in the image data to process the identification of the suspected tamper.

In FIG. 3, in accordance to this disclosure, each input image will pass through the stack of convolution layers that filters and classifies the objects within the input image data based on values or parameter of the input image. Similarly, each of the input image relates to the plurality of input parameters and will pass through the stack of convolution layer to classify the parameters based on variations of each of the input parameters. The computed data of the input image is fed to the polling layer. The poling layer may be a minimum or maximum pooling layer. In accordance with this disclosure, the max pooling layer may reduce the number of parameters by downsampling the input image which reduces the dimensionality of each input image but retains important information. The fully connected layer is known as an output layer that outputs the analysis of the convolution and polling layer by flattening and turning the analysis into a single vector to provide a classification decision as an output parameter.

Figure 4:
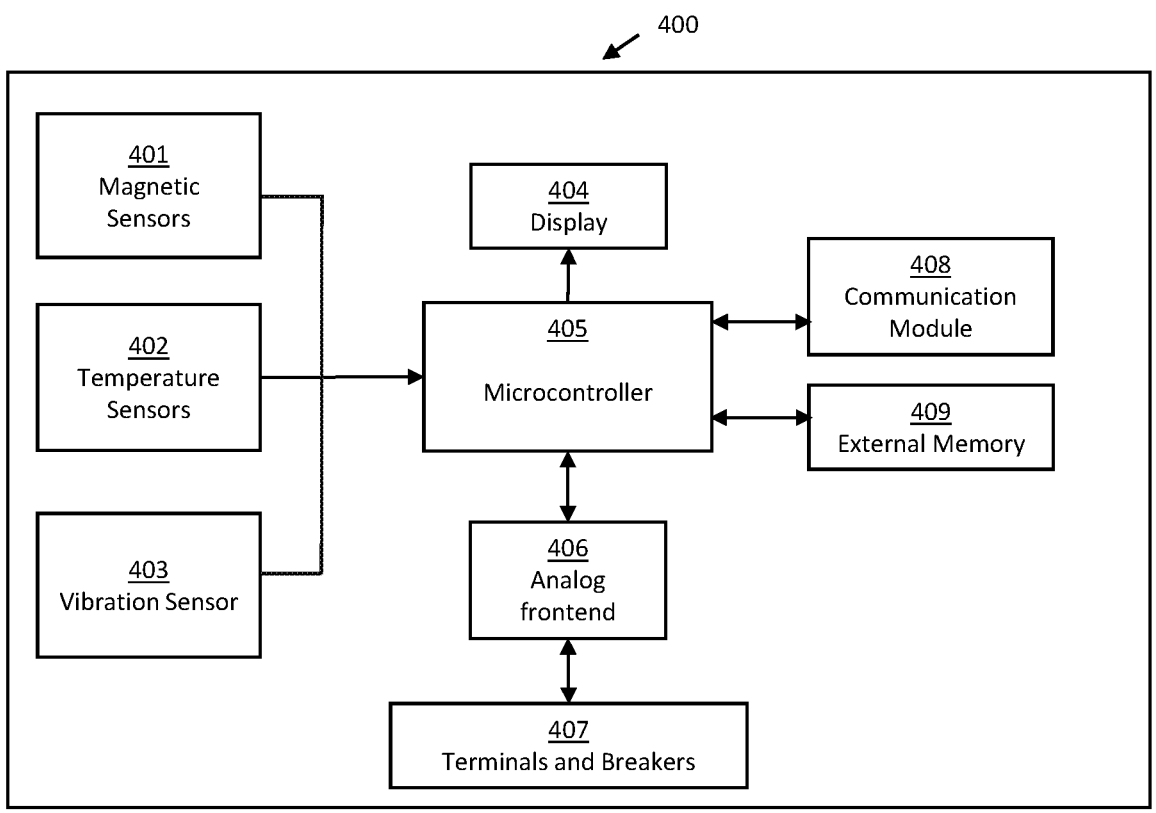
FIG. 4 illustrates an example of an energy meter including tamper detection in accordance with features of the embodiments.

FIG. 4 illustrates the architecture of an energy meter 400. The energy meter 400 is configured to detect tampers in accordance with this present disclosure. The energy meter 400 includes a plurality of sensors 401-403, a microcontroller 405, an analog frontend 406, terminals and breakers 407, a display 404, an external memory 409 and a communication module 408. The plurality of sensors 401-403 are configured to obtain data relating to one or more input parameters. In accordance with this disclosure, the plurality of sensors include at least one of a magnetic sensor 401, a temperature sensor 402 and a vibration sensor 403. The plurality of sensors 401-403 are not limited to only the sensors illustrated in FIG. 4. Alternately and additionally, the sensors may also include other sensors that can obtain parameter data for a particular type of tamper, for example, such as ESD and or jammers. For the illustration of FIG. 4, each sensor provides input parameter data based on a type of input signal obtained from the least one magnetic sensor 401, the temperature sensor 402 and the vibration sensor 403. The plurality of sensors feed the obtained input data to the at the least one microcontroller/processor 405.

As shown in FIG. 4, the microcontroller 405 is communicatively connected with external memory 409. An algorithm may be stored in external memory 409 or within an internal storage memory of the microcontroller 405. The microcontroller 405 is configured to obtain input data from the plurality of sensors 401-403. The microcontroller 405 in association with the plurality of sensors 401-403 is configured to sense the one or more input parameters based on the type of input signal including for example, at least one of magnetic, electric, frequency and mechanical vibration. The microcontroller 405 in association with the algorithm stored in the external memory 409 maps one or more of the input parameters with a tamper type to provide classification of one or more output parameters.

In FIG. 4, the energy meter 400 further includes an analog frontend 406 that feeds signal to the microcontroller 405. The signals may be at least one of an electric signal, a load signal, and a control signal. The analog frontend 406 provides amplification or conditioning to the received signal from the terminals or breaker 407. The signals from the terminals or breakers 407, may require amplification and conditioning to provide a proper signal to the microcontroller 405. The analog frontend 406 may use analog amplifiers to provide amplified and conditioned input signals to the microcontroller. In another embodiment, the analog frontend 406 may also provide conversion from analog to digital signal through ADC converter circuits located in the analog frontend 406. The analog frontend 406 provides flexibility and configurable electronic functions to the microcontroller 405.

As shown in FIG. 4, the microcontroller 405 is configured to compare one or more operating conditions of the energy meter with the one or more output parameters. The microcontroller 405 is configured identify one or more suspected tampers using the comparison of the one or more operating conditions with the one or more output parameters. The microcontroller 405 is configured to update the one or more input parameters classified with a suspected tamper into the external memory 409. In accordance with this disclosure, the microcontroller 405 is further configured to detect a tamper in at least one component of the energy meter based on the identified suspected tamper and a change in the characteristics of at least one of the output parameters. The identified one or more suspected tampers may be reported to the utility using the communication module 408 using at least one of wireless or wired communication means. In accordance with this disclosure, the communication module 408 may communicate with the microcontroller 405 to disconnect the meter from the local load using terminals and breakers 407 when a household or commercial user is suspected with the tampering of the energy meter 400.

Terminals and breakers 407 further provide circuit protection to the microcontroller 405 from the electrical connection of the load line and protection to the electrical circuits of the microcontroller 405 from damage caused by excess currents such as for example, an overload or short circuit. Breakers 407 may stop the load or electricity to the energy meter 400 or may stop the usage of the energy meter 400 based on the instruction from the communication module 408 or the microcontroller 405. The communication module is configured to receive instruction from the utility or power center via at least one of wireless or wired communication means based on detection of tampering to the energy meter 400. Upon receiving instruction, the communication module or the microcontroller configured to instruct the breaker to stop the usage of the energy meter.

As shown in FIG. 4, a display 404 is connected to the microcontroller in accordance to this disclosure. The display 404 is configured to provide a display of the electrical energy measured by the energy meter 400 and other information important to usage of the meter. The display 404 is arranged to display electrical usage, by wattage, voltage or current consumed or used at the energy meter. The display may also display, for example, the current date or time, location, and temperature etc. The display may be configured to show the one or more input parameters or the output parameters in accordance to this disclosure. The display 404 may be comprised of any currently known solid-state devices used to display information such as LED, OLED, LCD or TFT indicators and screens.

Figure 5:
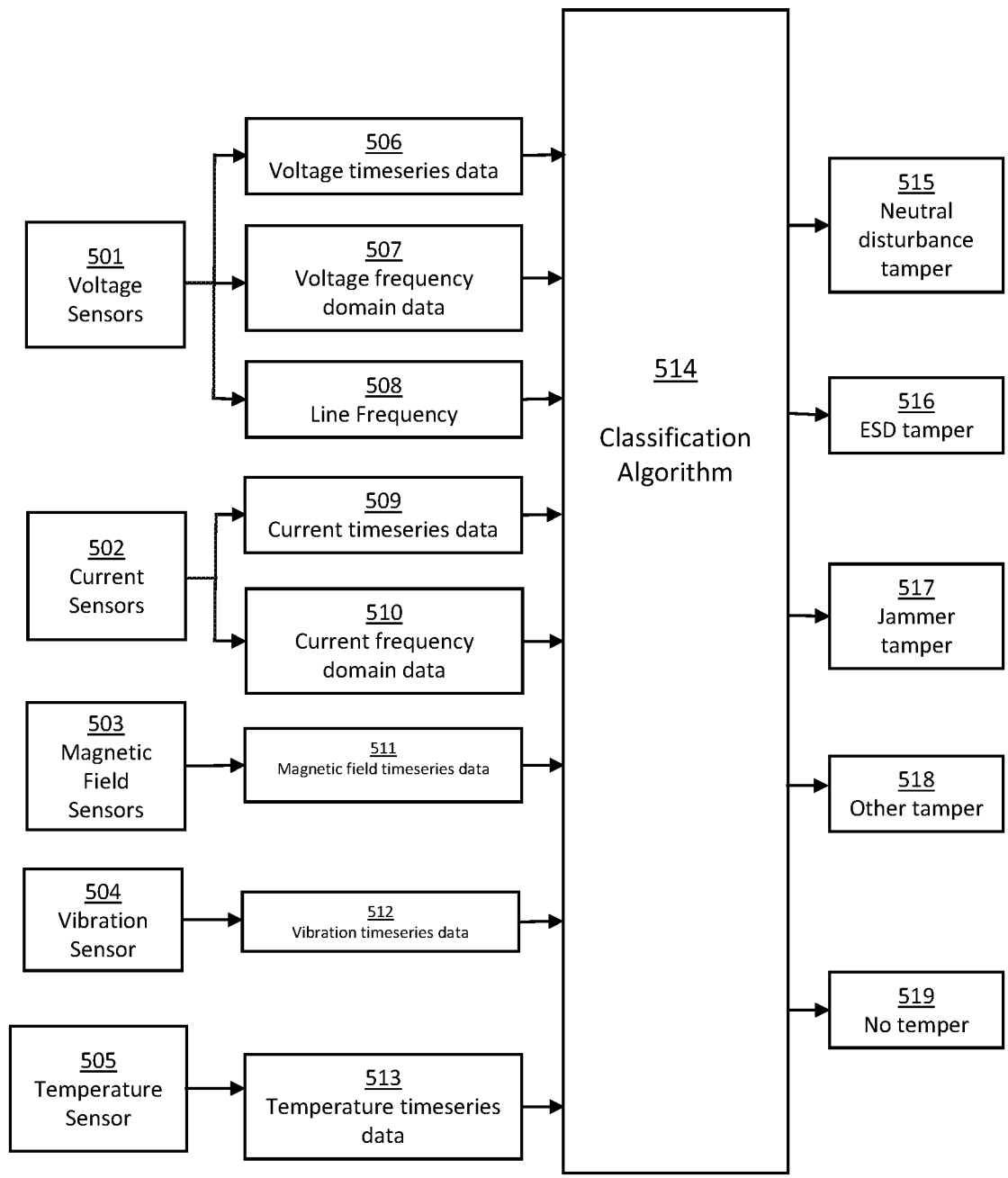
FIG. 5 illustrates an example of data flow of timeseries data in accordance with features of the embodiments.

FIG. 5 shows illustration of a data flow from a plurality of sensors 501-505 of the system 400 for detecting tampering of the energy meter. FIG. 5 shows a timeseries data 506-513 fed to a classification algorithm 514 to identify the suspected tampers 515-519. In accordance with this disclosure, the plurality of sensors may not be limited to voltage sensors 501, current sensors 502, magnetic field sensor 503, vibration sensor 504, and temperatures sensor 505. Each sensor may obtain data relating to one or more input parameters based on a type of input signal. The type of input signal includes at least one of magnetic, electric, frequency and mechanical vibration. The one or more input parameters includes at least one of magnetic field axis X, magnetic field axis Y, magnetic field axis Z, temperature, vibration input, RMS voltage, peak voltage, Fourier components of voltage and currents, RMS phase current, RMS Neutral current, R, Y, B voltages and currents, and power factor or line frequency.

As shown in FIG. 5, the plurality of sensors 501-505 obtains the one or more input parameters in the timeseries data which are not limited to at least one voltage timeseries data 506, voltage frequency domain data 507, line frequency 508, current timeseries data 509, current frequency domain data 510, magnetic field timeseries data 511, vibration timeseries 512, and temperatures timeseries data 513. The timeseries data 506-513 is fed to the classification algorithm 514 using at least one of an MLP or CNN algorithm shown at FIGS. 2 and 3 respectively. An RNN, LSTM or other decision tree algorithm may also be used. The classification algorithm 514 perform classification analysis on the timeseries data of the one or more input parameters. The timeseries data shows variation in the one or more output parameters to predict the tamper 515-519. The variation of timeseries data includes variation in any of voltage timeseries data 506, voltage frequency domain data 507, line frequency 508, current timeseries data 509, current frequency domain data 510, magnetic field timeseries data 511, vibration timeseries 512, and temperatures timeseries data 513.

The classification algorithm 514 employs nonlinear transformations or other computations with the plurality of input parameters 201n and a range of selection of hyperparameters to obtain the tamper classification of the energy meter 500. The classification algorithm 514 maps one or more of the input parameters with a tamper type to provide classification of one or more output parameters. The classification algorithm 514 compares one or more operating conditions of the energy meter 500 with the one or more output parameters to identify one or more suspected tampers using the comparison. The classification algorithm 514 updates the mapping of the one or more input parameters with the identified suspected tamper in the memory 110, 409 of the energy meter 100, 400, 500. The classification algorithm learns the one or more input parameters classification with the one or more output parameter using a backpropagation analysis of the classification algorithm 514. The backpropagation analysis provides training to the classification algorithm 200 which involves the calculation of weights for each of the nodes of the multilayers neural network includes the input layer, one or more of the hidden layers and the output layer.

The classification algorithm 514 further provides classification using a labeled dataset in the range of selection of a hyperparameter. The labeled dataset includes different tamper or non-tamper conditions corresponding to the one or more known conditions. The labeled dataset may be one or more of the input parameters that includes the range of selection of the hyperparameter. The selection of the hyperparameters can be one or more tuning parameters that provide control learning to the neural network of the classification algorithm 514. The one or more tuning parameters may be a value of the hyperparameters in terms of node weight of the classification algorithm.

The one or more input parameters comprise of at least one of voltage timeseries data 506, voltage frequency domain data 507, line frequency data 508, current timeseries data 509, current frequency domain data 510, magnetic field timeseries data 511, vibration timeseries 512, and temperatures timeseries data 513. The one or more of the input parameters are applied to the classification algorithm to provide the one or more output parameters based on backpropagation analysis of the classification algorithm. The labeled dataset may be applied to the classification algorithm in at least one of online mode or offline mode.

The classification algorithm 514 provides the suspected tamper based on the classification of the one or more input parameters and the one or more output parameters. In accordance with this disclosure, the classification algorithm 514 provides one or more parameters including a neutral disturbance tamper 515, an ESD tamper 516, a jammer tamper 517, and other tampers 518. The classification algorithm may indicate no tamper 519 in case there is no change in the one or more output parameter. In accordance with this disclosure, the classification algorithm is configured to detect a tamper in at least one component of the energy meter based on the identified suspected tamper and a change in characteristics of the at least one of the output parameters.

In an alternate embodiment, the one or more output parameters includes at least one of magnetic tamper, ESD tamper, cover open tamper, tampers using a jammer device, tampers using microwave sources, neural or input voltage disturbance scenarios and the drilling of the energy meter 500. The energy meter 500 may be configured as a single phase or 3 phase meter. It may be indoor or outdoor mounted and mounted on a pole. It may be used as a single individual unit or a part of a group of meters or any other configuration of meters.

In another alternate embodiment, the classification algorithm 514 may be a multilayer neural network as shown in FIG. 2 and FIG. 3. The classification algorithm 514 includes an input layer 201, one or more hidden layers 202, and an output layer 203. Similarly, the classification algorithm 514 may employ a CNN neural network including three layers such as a convolution layer, a pooling layer and a fully connected layer, as shown in FIG. 3. The classification algorithm is not limited to MLP or CNN type of neutral networks, and may include any of an RNN, LSTM or other decision tree algorithms.

Figure 6:
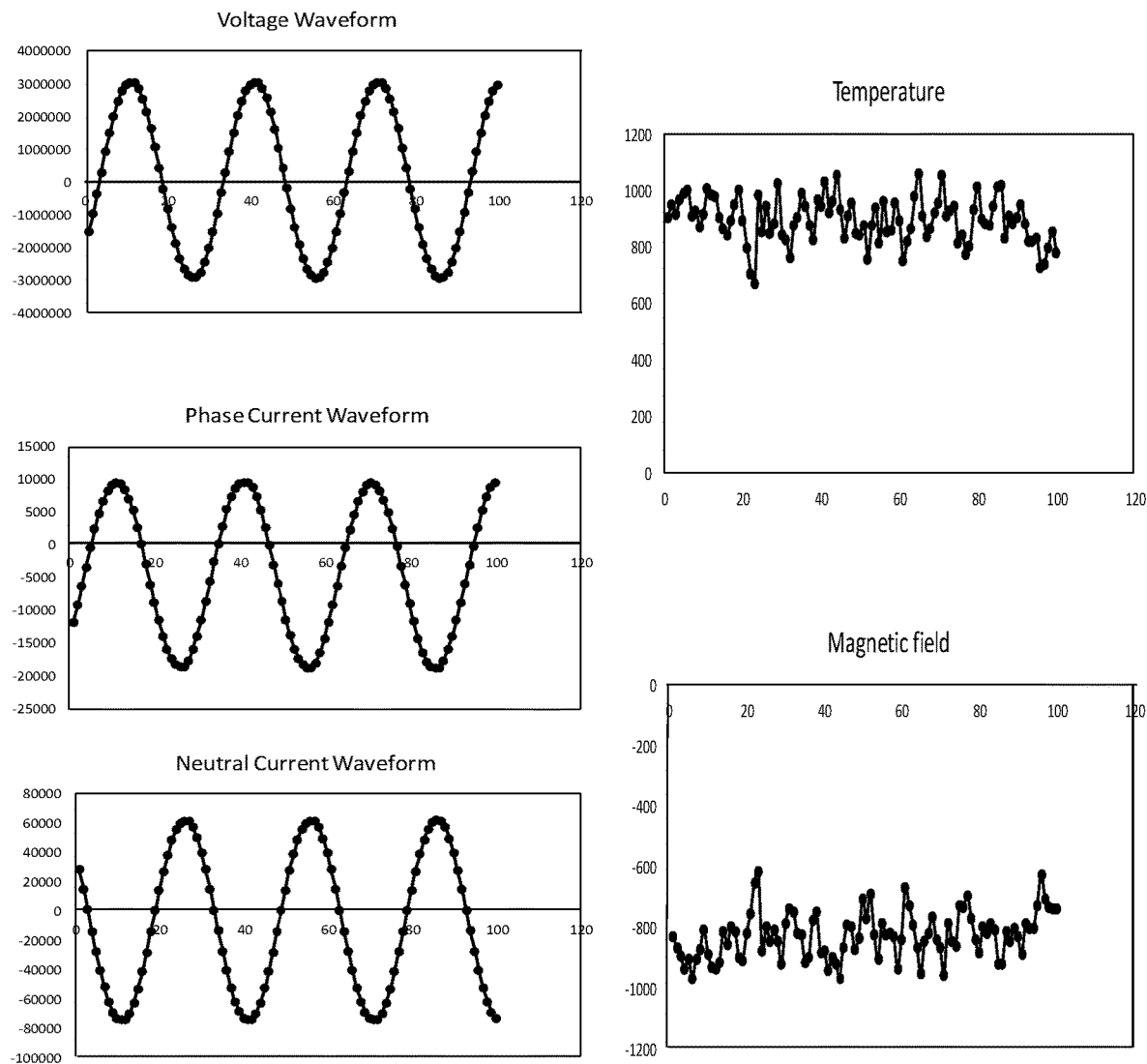
FIG. 6 illustrates graphs relating to no tamper conditions in the energy meter in accordance with features of the embodiments.

FIG. 6 shows graphs relating to no tamper conditions in the energy meters 400, 500. In the examples of FIG. 6, nominal variation of voltage is between +/−311 V in a single phase energy meter, nominal neutral current varies between +/−14 A. Similarly, the nominal temperature is around 30° C. and the magnetic field around 2 mT. The graphs shown at FIG. 6, indicate that there is no variation in the voltage waveform more than nominal +/−311 and no variation in the current waveform more that nominal +/−14 A. It should be noted that the X-Y axis as shown in the FIG. 6 are only for purposes of illustration and may not reflect valid scales for the input parameters shown.

Figure 7A:
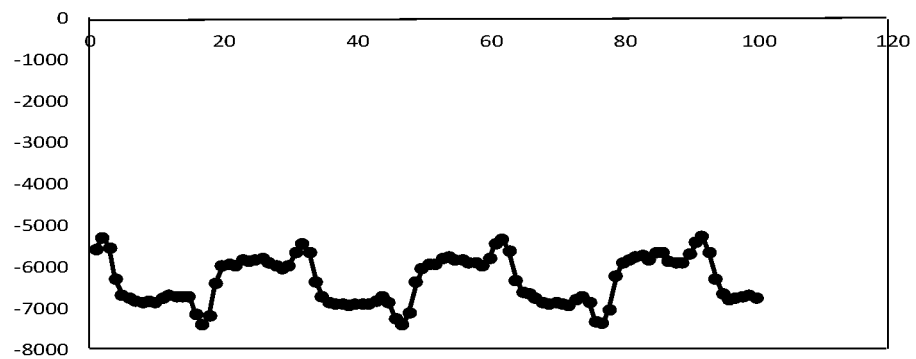
FIG. 7A illustrates a graph relating to identified neutral current tampers of the energy meter in accordance with features of the embodiments.

FIG. 7A graphs an identified neutral current tamper in the energy meter. It should be noted that the readings shown in the X axis is only for illustration purpose and not a valid scale for the neutral current. In the example of FIG. 7A, distortion of the neutral current waveform is shown. The comparison in timeseries parameter change in the neutral current waveform of FIG. 6 and FIG. 7A indicates a change in variation of the respective waveforms and evidence of tampering of the energy meter. The signature of the timeseries waveform of the neutral current shows an abnormal variation across the waveform as shown in FIG. 7A which indicates a neutral current tamper. The classification algorithm 514 through the graphed output parameter illustrated by FIG. 7A, identifies tampering of the energy meter through disturbance of neutral current in accordance to this disclosure.

Figure 7B:
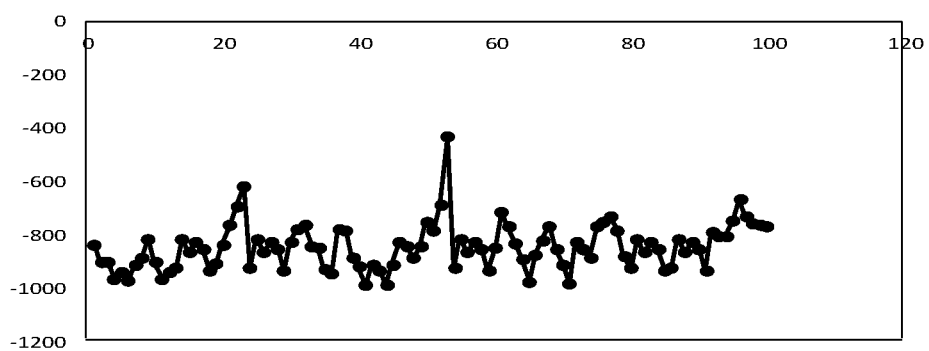
FIG. 7B illustrates graphs relating to identified ESD tampers in the energy meter in accordance with features of the embodiments.
Figure 7B:
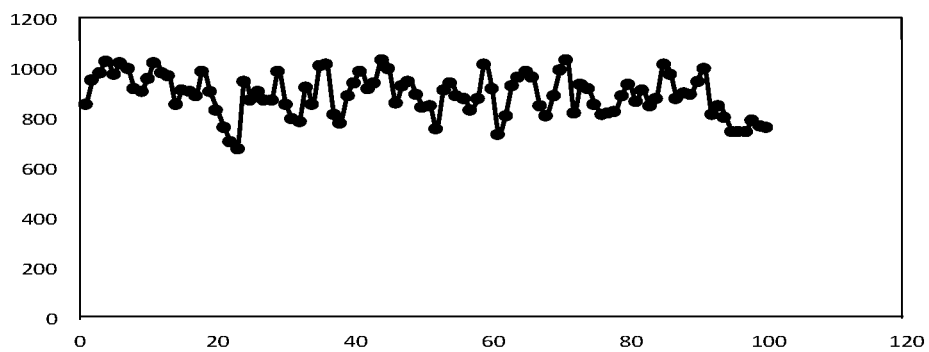

FIG. 7B shows graphs relating to an ESD tamper in the energy meter. In accordance with this disclosure FIG. 7B, the graphs of the magnetic field and temperature waveforms indicate peak variation in the entire waveform. The timeseries parameter of the magnetic field and temperature waveform in FIG. 7B are disturbed and not similar to the timeseries parameter of magnetic field and temperature waveform shown in FIG. 6. Again, this provides an indication that an ESD tamper has occurred in the energy meter. As was explained above for the neutral current disturbance, the classification algorithm 514 through the graphed output parameter illustrated by FIG. 7B, identifies ESD tampering of the energy meter through disturbance of magnetic field and temperature in accordance to this disclosure.

The examples shown in FIGS. 7A-7B are specifically presented for explaining neutral disturbance and ESD tampers. In an exemplary embodiment, there are similar variation in at least one of voltage, current, magnetic, temperature and frequency waveform that may be observed for other tamper such as a magnetic tamper, using of jammer device, using of microwave sources, open cover tampers, or physical damage/drilling of the energy meter. The classification algorithm 514 proactively observes the changes in the classified output parameter to detect a suspected tamper and report the suspected tamper to the utility via a communication module of the energy meter.

Figure 8:
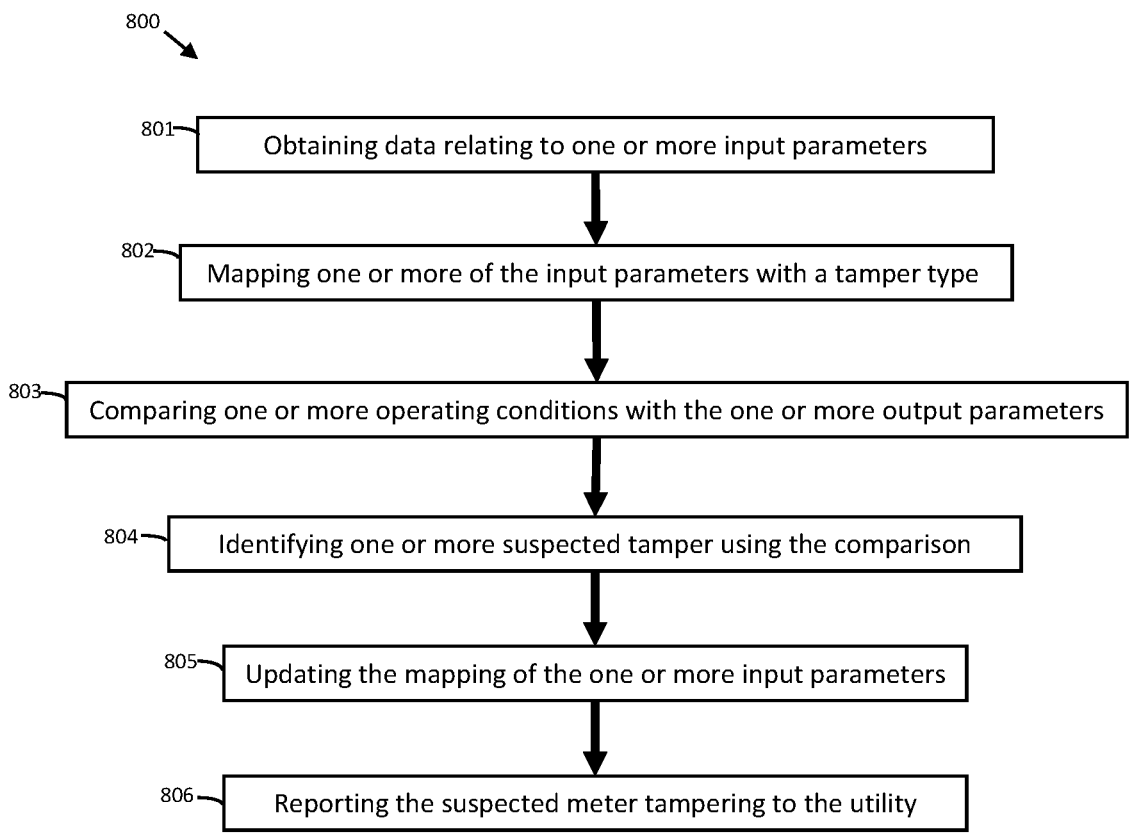
FIG. 8 illustrates a flow chart of a method to detect the type of tamper to an energy meter, in accordance with features of the embodiments.

As shown in FIG. 8, the method 800 is shown in accordance with the present disclosure for detecting and reporting suspected tampering of an energy meter. In step 801, the process obtains data relating to one or more input parameters of the energy meter. The plurality of sensors configured to sense the input parameter data based on a type of input signals of the energy meter. The type of input signal may include and not limited to at least one of magnetic, electric, frequency, and mechanical vibration. The one or more input parameters includes at least one of magnetic field axis X, magnetic field axis Y, magnetic field axis Z, temperature, vibration input, RMS voltage, peak voltage, Fourier components of voltage and currents, RMS phase current, RMS neutral current, R, Y, B voltages and currents, power factor or line frequency.

In step 802, mapping of one or more of the input parameters with a tamper type is made in order to provide classification of one or more output parameters of the energy meter. A classification algorithm stored in at least one memory coupled to at least one processor is configured to map the one or more input parameters with the tamper type to provide the classification of the one or more output parameters. The classification algorithm provides classification of the one or more output parameter using a labeled dataset that includes a range of selection of hyperparameter of the classification algorithm. The labeled dataset applied to the classification algorithm includes at least one of a MLP, CNN, RNN, and LSTM neural network. The labeled dataset further includes different tamper or non-tamper conditions that correspond to the one or more known conditions. The tamper or non-tamper conditions are applied by the classification algorithm to provide the one or more output parameters based on backpropagation by the classification algorithm.

In step 803, the method compares one or more operating conditions of the energy meter with the one or more output parameters. The classification algorithm provides the one or more output parameters based on a backpropagation analysis. The analysis made by classification algorithm is not limited to only backpropagation analysis. The classification algorithm may also perform classification analysis using at least of an MLP, CNN, RNN, LSTM or other known decision tree algorithms.

In step 804, the method identifies one or more suspected tampers using the comparison of the one or more operating condition of the energy meter with the one or more output parameters. The comparison of the input parameter and the output parameter is shown graphically in FIGS. 6, 7A and 7B. It should be noted that the comparison is not made graphically by the system. Graphs are only used here to illustrate how output parameters compare between a tamper and a no tamper parameters. FIG. 6 shows graphs of no tamper output parameters whereas FIGS. 7A and 7B shows the graph indicating variations in the timeseries parameter during the analysis. The one or more suspected tampers may include at least one of magnetic tamper, ESD tamper, cover open tamper, using a jammer device, using microwave sources, neutral or input voltage disturbance scenarios, and drilling the energy meter. The example shown in FIG. 7A-7B are specifically for neutral disturbance and ESD tamper. In an exemplary embodiment, there are similar variation in at least one of voltage, current, magnetic, temperature and frequency that may be observed for other tampers such as the magnetic tamper, use of a jammer device, use of microwave sources, cover open tamper, or physical damage/drilling of the energy meter.

In step 805, the method updates the mapping of the one or more input parameters with the suspected tamper identified. The classification algorithm 514 is stored in a memory associated with the microcontroller 100, 405. The memory may be internal or external memory 110, 409 as shown in FIGS. 4 and 5. Once the classification algorithm identifies the suspected tamper, the mapping of the one or more input parameter with suspected tamper may be updated to the external memory 409. The suspected tamper identified by the classification algorithm is stored in memory 409 for future use by the classification algorithm. The learning and updating by the classification algorithm is made on a continual basis. The learning and updating of the classification algorithm may be made offline and the learning parameters programmed to the meter. The learning and updating may also be online in the meter. The detection of the tamper may happen when the energy meter is installed and live. The energy meter may use the data from the plurality of sensors or the classified data from the external memory to predict the tamper condition and log the same into the external memory.

In step 806, the method reports the suspected meter tamper to the utility. The at least one microcontroller 405 is configured to report the suspected meter tamper using a communication module 408 coupled to the energy meter 400,500. The energy meter may perform push notifications to the utility company to indicate the tamper event. In another embodiment, the communication module 408 may report to microcontroller 405 disconnect command that cuts the local load from the energy meter and stops usage of the energy meter by a household or commercial user for tampering of the energy meter. In another embodiment, the microcontroller 405 is further configured to detect a tamper in at least one component of the energy meter based on an identified suspected tamper that changes the characteristics of at least one of the output parameters.

It is advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or.

The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system, or part thereof that controls at least one operation. A controller may be implemented in hardware or a combination of hardware and software/firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

While the present disclosure has described certain embodiments and generally associated methods, alterations and permutations of these embodiments and methods will be apparent to those skilled in the art. Accordingly, the above description of example embodiments does not define or constrain the present disclosure. Other changes, substitutions, and alterations are also possible without departing from the spirit and scope of the present disclosure, as defined by the following claims.

Specific Embodiments

While the following is described in conjunction with specific embodiments, it will be understood that this description is intended to illustrate and not limit the scope of the preceding description and the appended claims.

A first embodiment of the invention is a method for detecting and reporting suspected tampering of an energy meter, the method comprising (i) obtaining, using a plurality of sensors, data relating to one or more input parameters, the plurality of sensors configured to sense the input parameter data based on a type of input signals; (ii) mapping, one or more of the input parameters with a tamper type to provide classification of one or more output parameters; (iii) comparing, one or more operating conditions of the energy meter with the one or more output parameters; (iv) identifying, one or more suspected tamper using the comparison; (v) updating, the mapping of the one or more input parameters with the suspected tamper identified; and (vi) reporting the identified suspected tamper to the utility. An embodiment of the invention is one, any or all of prior embodiments in this paragraph up through the first embodiment in this paragraph, wherein the mapping of the one or more of the input parameters with the tamper type is based on an algorithm stored in at least one memory that is coupled to the at least one processor, and wherein the reporting of the identified suspected tamper is based on a communication module that is coupled to the at least one processor of the energy meter. An embodiment of the invention is one, any or all of prior embodiments in this paragraph up through the first embodiment in this paragraph, wherein the algorithm provides classification of the one or more output parameter using a labeled dataset includes a range of selection of hyperparameter of the algorithm, the labeled dataset applies to the algorithm includes at least one of a MLP, CNN, RNN, and LSTM neural network, the labeled dataset includes different tamper or non-tamper conditions correspond to the one or more known conditions applies to the algorithm to provide the one or more output parameters based on backpropagation of the algorithm. An embodiment of the invention is one, any or all of prior embodiments in this paragraph up through the first embodiment in this paragraph, wherein the labeled dataset applies to the algorithm in at least one of Online mode or Offline mode. An embodiment of the invention is one, any or all of prior embodiments in this paragraph up through the first embodiment in this paragraph, wherein the one or more input parameters includes at least one of Magnetic field axis X, Magnetic field axis Y, Magnetic field axis Z, Temperature, Vibration input, RMS voltage, Peak voltage, Fourier components of voltage and currents, RMS phase current, RMS Neutral current, R, Y, B voltages and currents, Power factor or Line frequency. An embodiment of the invention is one, any or all of prior embodiments in this paragraph up through the first embodiment in this paragraph, wherein the one or more output parameters includes at least one of Magnetic tamper, ESD tamper, cover open tamper, using jammer device, using microwave sources, neural current tamper, and drilling the energy meter. An embodiment of the invention is one, any or all of prior embodiments in this paragraph up through the first embodiment in this paragraph, wherein the type of input signal includes at least one of magnetic, electric, frequency, and mechanical vibration. An embodiment of the invention is one, any or all of prior embodiments in this paragraph up through the first embodiment in this paragraph, wherein the energy meter includes at least one of single phase, 3 phase, indoor/outdoor mounted, pole mounted, group meters or any other configuration of meters. An embodiment of the invention is one, any or all of prior embodiments in this paragraph up through the first embodiment in this paragraph, further comprising detecting a tamper in at least a component of the energy meter based on the identified suspected tamper and change in characteristics of the at least one of the output parameters.

A second embodiment of the invention is an apparatus for detecting and reporting suspected tampering of an energy meter, the apparatus comprising a plurality of sensors configured to obtain data relating to one or more input parameters, the plurality of sensors configured to sense the input parameter data based on a type of input signal; a communication module connected between the energy meter and a utility; at least one memory configured to store an algorithm; at least one processor coupled to the at least one memory and the communication module configured to map, using the algorithm, the one or more input parameters with a tamper type to provide classification of one or more output parameters, compare one or more operating conditions of the energy meter with the one or more output parameters using the algorithm, identify one or more suspected tamper types using the comparison; update, the algorithm, in order to change the mapping of the one or more input parameters with the suspected tamper type identified; and report the suspected tamper to the utility using the communication module. An embodiment of the invention is one, any or all of prior embodiments in this paragraph up through the second embodiment in this paragraph, wherein the at least one processor configured to provide classification of the one or more output parameter using a labeled dataset includes a range of selection of hyperparameter of the algorithm, and wherein the labeled dataset applies to the algorithm includes at least one of a MLP, CNN, RNN, and LSTM neural network, the labeled dataset includes different tamper or non-tamper conditions correspond to the one or more known conditions applies to the algorithm to provide the one or more output parameters based on backpropagation of the algorithm An embodiment of the invention is one, any or all of prior embodiments in this paragraph up through the second embodiment in this paragraph, wherein the labeled dataset applies to the algorithm in at least one of Online mode or Offline mode. An embodiment of the invention is one, any or all of prior embodiments in this paragraph up through the second embodiment in this paragraph, wherein the one or more input parameters includes at least one of Magnetic field axis X, Magnetic field axis Y, Magnetic field axis Z, Temperature, Vibration input, RMS voltage, Peak voltage, Fourier components of voltage and currents, RMS phase current, RMS Neutral current, R, Y, B voltages and currents, Power factor or Line frequency. An embodiment of the invention is one, any or all of prior embodiments in this paragraph up through the second embodiment in this paragraph, wherein the one or more output parameters includes at least one of Magnetic tamper, ESD tamper, cover open tamper, using jammer device, using microwave sources, neural current tamper, and drilling the energy meter. An embodiment of the invention is one, any or all of prior embodiments in this paragraph up through the second embodiment in this paragraph, wherein the type of input signal includes at least one of magnetic, electric, frequency, and mechanical vibration. An embodiment of the invention is one, any or all of prior embodiments in this paragraph up through the second embodiment in this paragraph, wherein the energy meter includes at least one of single phase, 3 phase, indoor/outdoor mounted, pole mounted, group meters or any other configuration of meters. An embodiment of the invention is one, any or all of prior embodiments in this paragraph up through the second embodiment in this paragraph, wherein the at least one processor configured to detect a tamper in at least a component of the energy meter based on the identified suspected tamper and change in characteristics of the at least one of the output parameters.

A third embodiment of the invention is a non-transitory computer readable medium, the non-transitory computer readable medium comprising instructions that, when executed, cause a processing device to (i) obtain, using a plurality of sensors, data relating to one or more input parameters, the plurality of sensors configured to sense the input parameter data based on a type of input signals; (ii) map, one or more of the input parameters with a tamper type to provide classification of one or more output parameters; (iii) compare, one or more operating conditions of the energy meter with the one or more output parameters; (iv) identify, one or more suspected tamper types using the comparison; (v) update, the mapping of the one or more input parameters with the suspected tamper type identified; and (vi) report the suspected meter tampering to the utility. The non-transitory computer readable medium of claim 18, wherein the algorithm provides classification of the one or more output parameter using a labeled dataset includes a range of selection of hyperparameter of the algorithm, the labeled dataset applies to the algorithm includes at least one of a MLP, CNN, RNN, and LSTM neural network, the labeled dataset includes different tamper or non-tamper conditions correspond to the one or more known conditions applies to the MLP neural network to provide the one or more output parameters based on backpropagation of the algorithm. The non-transitory computer readable medium of claim 18, wherein the labeled dataset applies to the algorithm in at least one of Online mode or Offline mode. The non-transitory computer readable medium of claim 18, wherein the one or more input parameters includes at least one of Magnetic field axis X, Magnetic field axis Y, Magnetic field axis Z, Temperature, Vibration input, RMS voltage, Peak voltage, Fourier components of voltage and currents, RMS phase current, RMS Neutral current, R, Y, B voltages and currents, Power factor or Line frequency. The non-transitory computer readable medium of claim 18, wherein the one or more output parameters includes at least one of Magnetic tamper, ESD tamper, cover open tamper, application of ESD, using jammer device, using microwave sources, disturbance scenarios, drilling the energy meter. The non-transitory computer readable medium of claim 18, wherein the type of input signal includes at least one of magnetic, electric, frequency, and mechanical. The non-transitory computer readable medium of claim 18, wherein the energy meter includes at least one of single phase, 3 phase, indoor/outdoor mounted, pole mounted, group meters or any other configuration of meters. The non-transitory computer readable medium of claim 18, wherein the instructions when executed cause the processing device to detect a tamper in at least a component of the energy meter based on the identified suspected tamper and change in characteristics of the at least one of the output parameters.

Without further elaboration, it is believed that using the preceding description that one skilled in the art can utilize the present invention to its fullest extent and easily ascertain the essential characteristics of this invention, without departing from the spirit and scope thereof, to make various changes and modifications of the invention and to adapt it to various usages and conditions. The preceding preferred specific embodiments are, therefore, to be construed as merely illustrative, and not limiting the remainder of the disclosure in any way whatsoever, and that it is intended to cover various modifications and equivalent arrangements included within the scope of the appended claims.

In the foregoing, all temperatures are set forth in degrees Celsius and, all parts and percentages are by weight, unless otherwise indicated.

The invention claimed is:

1. A method for detecting and reporting to a utility a suspected tamper of an energy meter, the method comprising:
   (i) obtaining, using a plurality of sensors, data relating to one or more input parameters, the plurality of sensors configured to sense the input parameter data based on a type of input signals;
   (ii) mapping, one or more of the input parameters with a tamper type to provide classification of one or more output parameters;
   (iii) comparing, one or more operating conditions of the energy meter with the one or more output parameters;
   (iv) identifying, one or more suspected tamper using the comparison;
   (v) updating, the mapping of the one or more input parameters with the suspected tamper identified; and
   (vi) reporting the suspected meter tampering to the utility.

2. The method of claim 1, wherein the mapping of the one or more of the input parameters with the tamper type is based on an algorithm stored in at least one memory that is coupled to the at least one processor, and wherein the reporting of the identified suspected tamper is based on a communication module that is coupled to the at least one processor.

3. The method of claim 2, wherein the algorithm provides classification of the one or more output parameter using a labeled dataset includes a range of selection of hyperparameter of the algorithm, the labeled dataset applies to the algorithm includes at least one of a Multilayer Perceptron (MLP), Convolutional Neural Network (CNN), Recurrent Neural Network (RNN), and Long Short-Term Memory (LSTM) neural network, the labeled dataset includes different tamper or non-tamper conditions correspond to the one or more known conditions applies to the algorithm to provide the one or more output parameters based on backpropagation of the algorithm.

4. The method of claim 3, wherein the labeled dataset applies to the algorithm in at least one of an online mode or an offline mode.

5. The method of claim 1, wherein the one or more input parameters includes at least one of magnetic field axis X, magnetic field axis Y, magnetic field axis Z, temperature, vibration input, Root-Mean-Square (RMS) voltage, peak voltage, Fourier components of voltage and currents, RMS phase current, RMS Neutral current, Red (R), Yellow (Y), Blue (B) voltages and currents, power factor or line frequency.

6. The method of claim 1, wherein the one or more output parameters includes at least one of magnetic tamper, Electrostatic Discharge (ESD) tamper, cover open tamper, using a jammer device, using microwave sources, neural or input voltage disturbance scenarios, or drilling the energy meter.

7. The method of claim 1, wherein the type of input signal includes at least one of magnetic, electric, frequency, and mechanical vibration.

8. The method of claim 1, further comprising detecting a tamper in at least a component of the energy meter based on the identified suspected tamper that change the characteristics of at least one of the output parameters.

9. An apparatus for detecting and reporting suspected tampering of an energy meter, the apparatus comprising:
   a plurality of sensors configured to obtain data relating to one or more input parameters, the plurality of sensors configured to sense the input parameter data based on a type of input signal;
   a communication module connected between the energy meter and a utility;
   at least one memory configured to store an algorithm;
   at least one processor coupled to the at least one memory and the communication module configured to:
      map, using the algorithm, the one or more input parameters with a tamper type to provide classification of one or more output parameters, compare one or more operating conditions of the energy meter with the one or more output parameters using the algorithm,
      identify one or more suspected tamper types using the comparison;
      update, the algorithm, in order to change the mapping of the one or more input parameters with the suspected tamper type identified; and
      report the suspected tamper to the utility using the communication module.

10. The apparatus of claim 9, wherein the at least one processor is configured to provide classification of the one or more output parameter using a labeled dataset that includes a range of selection of hyperparameters of the algorithm, and wherein the labeled dataset applies to the algorithm includes at least one of a Multilayer Perceptron (MLP), Convolutional Neural Network (CNN), RNN, and Long Short-Term Memory (LSTM) neural network, the labeled dataset includes different tamper or non-tamper conditions corresponding to the one or more known conditions that applies to the algorithm to provide the one or more output parameters based on backpropagation of the algorithm.

11. The apparatus of claim 10, wherein the labeled dataset applies to the algorithm in at least one of an online mode or an offline mode.

12. The apparatus of claim 9, wherein the one or more input parameters includes at least one of magnetic field axis X, magnetic field axis Y, magnetic field axis Z, temperature, vibration input, Root-Mean-Square (RMS) voltage, peak voltage, Fourier components of voltage and currents, RMS phase current, RMS neutral current, Red (R), Yellow (Y), Blue (B) voltages and currents, power factor or line frequency.

13. The apparatus of claim 9, wherein the one or more output parameters includes at least one of magnetic tamper, Electrostatic Discharge (ESD) tamper, cover open tamper, using a jammer device, using microwave sources, disturbance scenarios, or drilling the energy meter.

14. The apparatus of claim 9, wherein the type of input signal includes at least one of magnetic, electric, frequency, and mechanical vibration.

15. The apparatus of claim 9, wherein the at least one processor is configured to detect a tamper in at least a component of the energy meter based on the identified suspected tamper and change in characteristics of at least one of the output parameters.

16. A non-transitory computer readable medium, the non-transitory computer readable medium stores an algorithm comprising instructions that, when executed, cause a processing device to:
   (i) obtain, using a plurality of sensors, data relating to one or more input parameters, the plurality of sensors configured to sense the input parameter data based on a type of input signals;

(ii) map, one or more of the input parameters with a tamper type to provide classification of one or more output parameters;
(iii) compare, one or more operating conditions of the energy meter with the one or more output parameters;
(iv) identify, one or more suspected tamper types using the comparison;
(v) update, the mapping of the one or more input parameters with the suspected tamper type identified; and
(vi) report the suspected meter tampering to a utility.

17. The non-transitory computer readable medium of claim 16, wherein the algorithm provides classification of the one or more output parameters using a labeled dataset that includes a range of selection of hyperparameters of the algorithm, the labeled dataset applied to the algorithm includes at least one of a Multilayer Perceptron (MLP), Convolutional Neural Network (CNN), Recurrent Neural Network (RNN), and Long Short-Term Memory (LSTM) neural network, the labeled dataset includes different tamper or non-tamper conditions corresponding to the one or more known conditions applied to the MLP neural network to provide the one or more output parameters based on the backpropagation of the algorithm.

18. The non-transitory computer readable medium of claim 16, wherein the one or more input parameters includes at least one of magnetic field axis X, magnetic field axis Y, magnetic field axis Z, temperature, vibration input, Root-Mean-Square (RMS) voltage, peak voltage, Fourier components of voltage and currents, RMS phase current, RMS neutral current, Red (R), Yellow (Y), Blue (B) voltages and currents, power factor or line frequency.

19. The non-transitory computer readable medium of claim 16, wherein the one or more output parameters includes at least one of magnetic tamper, Electrostatic Discharge (ESD) tamper, cover open tamper, using a jammer device, using microwave sources, disturbance scenarios, or drilling the energy meter.

20. The non-transitory computer readable medium of claim 16, wherein the mapping of the one or more of the input parameters with the tamper type is based on the algorithm stored the non-transitory computer readable medium that is coupled to the at least one processor, and wherein the reporting of the identified suspected tamper is based on a communication module that is coupled to the at least one processor.

* * * * *